United States Patent [19]

Mohaupt et al.

[11] Patent Number: 4,617,707

[45] Date of Patent: Oct. 21, 1986

[54] METHOD FOR THE MANUFACTURE OF AN ULTRASONICS ANTENNA ARRAY

[75] Inventors: Jutta Mohaupt, Munich; Karl Lubitz, Ottobrunn; Manfred Schnoeller, Haimhausen; Wolfram Wersing, Kirchheim, all of Fed. Rep. of Germany

[73] Assignee: Siemens Aktiengesellschaft, Berlin & Munich, Fed. Rep. of Germany

[21] Appl. No.: 773,877

[22] Filed: Sep. 9, 1985

[30] Foreign Application Priority Data

Sep. 27, 1984 [DE] Fed. Rep. of Germany ....... 3435569

[51] Int. Cl.⁴ ........................................... H01L 41/22
[52] U.S. Cl. ..................... 29/25.35; 29/424; 156/89; 264/59; 264/61; 310/369
[58] Field of Search ................. 29/25.35, 424; 156/89; 264/59, 61; 310/369, 367

[56] References Cited

U.S. PATENT DOCUMENTS 3,037,885  6/1962  Abolins ................................ 29/603
3,781,955  1/1974  Lavrinenko et al. .............. 29/25.35
4,514,240  4/1985  Herand .................................. 264/59

Primary Examiner—Carl E. Hall
Attorney, Agent, or Firm—Hill, Van Santen, Steadman & Simpson

[57] ABSTRACT

A method for the manufacture of a linear or annular ultrasonics antenna array for the megahertz range, which consists in providing a laminate of alternating layers of unsintered ceramic and spacing layers, the spacing layers being composed of a filler material which is heat fugitive at the sintering temperature of the ceramic, the spacing material also including refractory grains distributed therein of a size which corresponds to the spacing desired between the ceramic layers, sintering the laminate to thereby liberate the filler material and leave voids between the refractory grains, impregnating the resulting laminate with a polymerizable resin to bond the sintered ceramic layers together, and separating the resulting laminate into individual transducer elements.

8 Claims, 3 Drawing Figures

METHOD FOR THE MANUFACTURE OF AN ULTRASONICS ANTENNA ARRAY

BACKGROUND OF THE INVENTION

1. Field of the Invention

The present invention is in the field of manufacturing ultrasonics antenna arrays for the megahertz range and involves stacking raw ceramic foils and spacing layers alternately, sintering the stack to liberate the filler material contained in the spacing layers and thereby provide cavities in the spacing layers which are then filled with a plastic material after which the stack is subdivided into wafers which contain the transducer elements.

2. Description of the Prior Art

For the directional transmission of ultrasonics, it is known to employ transmission transducers which act as antennas, being composed of a plurality of transducer elements in the form of an array. Depending upon the individual circumstances, these transducer elements can be fed with an electrical excitation voltage in phase or shifted in phase with respect to other voltages, and can be excited to oscillation. The same applies by analogy for the directional reception of ultrasonic radiation with such an array arrangement wherein the received signals of the individual transducer elements are superposed in a corresponding way.

There are no significant problems for constructing an array antenna of individual transducer elements for lower frequency ranges of ultrasonics. Difficulties arise, however, when higher frequencies, for example, more than 1 MHz or especially frequencies between 5 and 10 MHz are required, because the size of the individual transducer elements which are to be operated in resonance or self-resonance becomes extremely small. Such an antenna having a linear arrangement has, for example, 100 to 200 elements which are divided into a number of groups which operate electrically connected to each other.

For manufacturing such an antenna array, plates of completely sintered piezoceramic materials have been used to form the base, which has then been slotted with a sawing method such that individual transducer elements are formed to provide the entire array device. There are also array antennas which comprise transducer elements having an essentially concentric arrangement relative to each other.

SUMMARY OF THE INVENTION

The present invention provides a simplified manufacturing method for antenna arrays which are dimensioned for the MHz range. This objective is achieved by providing a laminate of alternating layers of unsintered ceramic and spacing layers. The laminate may be planar in form or consist of alternating convolutions of the unsintered ceramic and the spacer material. The spacing layers include a filler material which is heat fugitive at the sintering temperature of the ceramic. The spacing material also includes refractory grains which are distributed therein having a size which corresponds to the spacing desired between the ceramic layers. The laminate is then sintered to thereby liberate the filler material and leave voids between the refractory grains. These voids are impregnated with a polymerizable resin to bond the sintered ceramic layers together. The resulting laminate is then subdivided into individual transducer elements. Then, electrodes can be applied to the individual transducer elements.

One of the preferred embodiments of the present invention provides using unsintered layers of ceramic in the form of foils. These foils may be coated with the spacing materials before the foils and the spacing materials are formed into a laminate.

The preferred refractory grains are composed of zirconium oxide, aluminum oxide, or magnesium oxide, or mixtures thereof.

The polymerizable resin may include an expansible agent which expands at a temperature substantially above the polymerization temperature of the polymerizable resin but below the decomposition temperature thereof.

The present invention provides a favorable manufacturing method for an antenna array which provides a substantially integrated method sequence. In the present invention, the basis for the shape of the array is already established before the implementation of the sintering process, so that less involved processing measures are required after sintering. Above all, the invention does not require such processing measures after sintering as in the prior art which can lead to higher reject rates. Such higher reject rates occur, for example, when sawing of fine structures is required.

BRIEF DESCRIPTION OF THE DRAWINGS

A further description of the present invention will be made in connection with the attached sheet of drawings in which.

DESCRIPTION OF THE PREFERRED EMBODIMENTS

Figure 1:
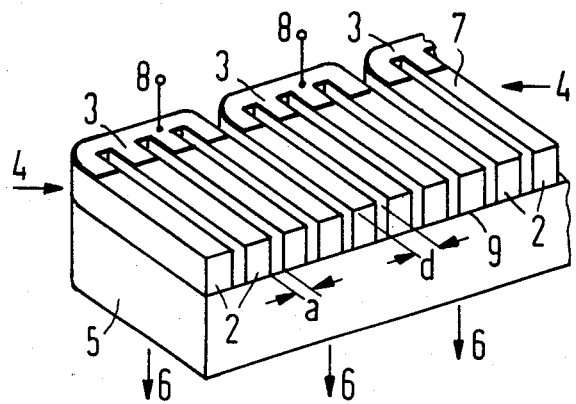
FIG. 1 is a view in perspective of an antenna array manufactured in accordance with the present invention.

FIG. 1 illustrates a linear antenna array 1 comprising transducer elements 2 manufactured in accordance with the invention. These transducer elements 2 are elongated, cuboid strips of a piezoceramic material. The transducer elements 2 are arranged such that the spacing between neighboring elements amounts, for example, to about 0.07 mm and the width of the transducer elements measured in the same direction may amount, for example, to 0.15 mm. The lengths of the individual transducer elements can be 10 to 50 mm and the thickness is normally in the range of two to three times the width dimension.

Figure 2:
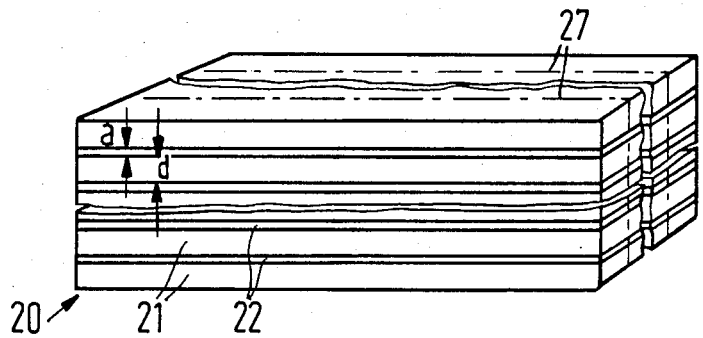
FIG. 2 illustrates an intermediate stage in the manufacture of the antenna array of FIG. 1.

In accordance with the present invention, the manufacture of the transducer element 4 or of the transducer elements 2 proceeds as described herein. FIG. 2 illustrates a member 20 which is composed of foils 21 of unsintered green ceramic, the foils being disposed on top of one another. Spacers 22 separate the foils 21 and are composed of layers of a filler material having, for example, grains embedded therein having a spacing dimension a. The thickness of the foils is illustrated at dimension d. The filler material is a material which is liberated during the sintering process either by pyrolysis or thermal decomposition. One particularly preferred material for use in this connection is graphite. Polyvinyl alcohol is also suitable. Refractory particles such as zirconium oxide, magnesium oxide, and/or aluminum oxide powders can be employed as the refractory grains within the spacing materials, these powders preferably having a narrow grain size distribution. The particle size of the powder determines the spacing between the ceramic layers. The filler material in the spacing layers 22 containing the grains is preferably applied by printing onto prefrabricated raw ceramic foil strips 23 by means of a silk screening method, and then the foil strips 23 are placed on top of one another to provide a stack 20.

After stacking, the raw laminate of FIG. 2 is sintered. As a consequence of the high temperatures employed during the sintering process, the filler material of the spacing layers 22 is liberated by oxidation or the like so that cavities arise between the grains. The refractory zirconium oxide or aluminum oxide particles still remain in the cavities. The remaining grains provide a mechanical connection of the sintered foils 21 to one another.

The cavities which arise due to the burn-out of the filler material are then filled with a polymerizable, swelling plastic material preferably by means of a vacuum casting method. When an already polymerized material is too viscous for casting, the polymerization is carried out after casting.

The polymerized casting material forms a mechanical connection of the original foil strips. By means of the swelling, it is possible to loosen the existing mechanical contacts in the sintered ceramic whose interstices are filled with the plastic material and the grains contained therein. In the sintered ceramic member whose interstices are filled with a plastic material, the mechanical contacts between the grains can be broken, but the adhesive property of the plastic material continues to guarantee a reliable coherence. Suitable plastic materials include polyurethane, polystyrene, polymethacrylate, polymethylmethacrylate and the like. Suitable swelling materials are benzosulfonic acid, hydrazine, and fluorochloromethane derivatives.

The existence of the plastic material opposes breakage. The sintered stack shown in FIG. 2 is then cut into wafers as indicated by saw cuts 27. Transducer element arrangements, one of which is shown in FIG. 1, are obtained therefrom.

Figure 3:
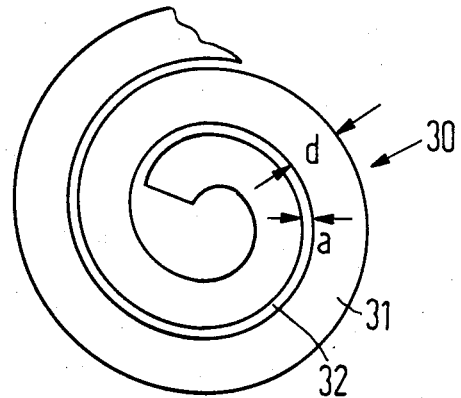
FIG. 3 illustrates a second example of an antenna array manufactured in accordance with this invention.

FIG. 3 illustrates an embodiment of the invention for manufacturing an antenna array in which the transducer elements are in annular, convoluted form. A green ceramic film 31 elongated in the direction perpendicular to the illustration of FIG. 3 is provided, FIG. 3 showing the end face of the winding composed of such a raw ceramic and including a filler material 32 situated between the individual turns and containing spacing grains. The same type of filler material and grains can be used for this embodiment as described in connection with FIGS. 1 and 2. The winding shown in FIG. 3, composed of several turns, is sintered and is thus transformed into a fixed shape. As a consequence of the burn-out of the filler material 32, cavities or pores such as the interstices 22 shown in FIG. 2 are present between the individual turns of the winding. The individual, thin transducer spirals 30 which are to be employed as transmission or reception antennas, are separated from the winding of FIG. 3 into individual components by means of saw cuts parallel to the plane of the illustration of FIG. 3.

Some saw cuts are also required in the method of the present invention but not such fine saw cuts with which extremely small spacings such as 0.005 to 0.02 mm as required in the transducer elements of the prior art. The saw cuts required in this invention are not difficult because the thickness dimensions of at least 0.3 mm exist, and usually between 0.5 and 1 mm.

The raw ceramic foils employed in the invention are produced in accordance with known foil drawing or casting methods, whereby the foils are given a thickness dimension which is equal to the width of the transducer elements 2 as described in connection with FIG. 1.

As mentioned, cavities between the foils arise with the sintering of the ceramic foil stack of FIG. 2 or the winding of FIG. 3 due to the burning and decomposition of the filler. Prior to carrying out the saw cuts 27, the cavities may be filled with a plastic material which contains a swelling agent. The swelling agent of the type described is one that decomposes at a temperature which is considerably above the polymerization temperature of the plastic material but is substantially below its decomposition temperature. Instead of adding a swelling agent, a plastic which itself produces a swelling effect with partial decomposition, and without significantly losing its adhesive property, can also be provided for filling the cavities.

In addition to the saw cuts shown at reference numeral 27, the material can be ground after cutting.

Electrode coatings 7 shown in FIG. 1 can be applied by sputtering. The polarization of the transducer elements 2 or of the transducer element arrangement 4 or of the spiral antennas 30 manufactured from the winding of FIG. 3 can take place in accordance with known measures, such, for example, as polarizing in a protective atmosphere of sulfur hexafluoride under the influence of a high potential voltage.

As mentioned previously, the cavities which arise after sintering are filled with plastic. This has the advantage that it prevents surfaces of the transducer elements 2 lying opposite one another in the transducer element arrangement 4 from being covered with electrode material during sputtering or vapor deposition with the electrode material. These interstices may be freed by subsequently dissolving the plastic out, whereby electrode material applied to the surfaces of the plastic is also eliminated. Only the electrode coatings which are shown on the array of FIG. 1 still remain.

FIG. 1 also illustrates electrode elements 3 which are applied to the elements 2 at one end of the transducer elements 2, having electrical contact to the electrodes 7. In the example of FIG. 1, four adjacent transducer elements 2 of the transducer element arrangement 4 are electrically connected to each other with the electrode elements 3. The leads from the electrode elements 3 are identified at reference numeral 8. The components of the overall electrical signal with which the antenna array is to be supplied can be applied to the individual terminals 8 according to a predetermined pattern. The same is true in the case of the use of the antenna as a receiving antenna.

The number of layers or foils 21 provided in a stack 20 can be so large that the wafers arising by providing the saw cuts 27 yield the complete transducer element arrangement 4. Such an arrangement can, however, also be composed of a plurality of parts produced by the saw cuts 27. A stack 20 is then produced having such a plurality of layers or foils 21 which, multiplied by a whole number, yields the total number of desired transducer elements 4.

It will be evident that various modifications can be made to the described embodiments without departing from the scope of the present invention.

We claim as our invention:

1. A method for the manufacture of an ultrasonic antenna array composed of a juxtaposed arrangement of piezoceramic transducer elements comprising:

providing a laminate of alternating layers of unsintered ceramic and spacing layers, said spacing layers being composed of a filler material which is heat fugitive at the sintering temperature of said ceramic, said spacing material also including refractory grains distributed therein of a size which corresponds to the spacing desired between the ceramic layers, sintering said laminate to thereby liberate said filler material and leave voids between said refractory grains, impregnating the resulting laminate with a polymerizable resin to bond the sintered ceramic layers together, and separating the resulting laminate into individual transducer elements.

2. A method according to claim 1 which includes the step of:
applying electrodes to said individual transducer elements.

3. A method according to claim 1 wherein said unsintered layers of ceramic are in the form of foils.

4. A method according to claim 1 wherein said laminate is in the form of a wound coil.

5. A method according to claim 3 wherein said foils are coated with the spacing material before the foils and said spacing materials are formed into a laminate.

6. A method according to claim 1 wherein said refractory grains are composed of zirconium oxide, aluminum oxide, or magnesium oxide, or mixtures thereof.

7. A method according to claim 1 in which said polymerizable resin includes an expansible agent which expands at a temperature substantially above the polymerization temperature of said polymerizable resin but below the decomposition temperature thereof.

8. A method according to claim 1 wherein said individual transducer elements are secured to adapters.

* * * * *